(12) United States Patent
Isagoda et al.

(10) Patent No.: US 10,770,818 B2
(45) Date of Patent: Sep. 8, 2020

(54) ELECTRICAL CONTACT AND ELECTRIC COMPONENT SOCKET

(71) Applicant: ENPLAS CORPORATION, Kawaguchi-shi, Saitama (JP)

(72) Inventors: Satoru Isagoda, Kawaguchi (JP); Hokuto Kanesashi, Kawaguchi (JP); Akira Miura, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/339,274

(22) PCT Filed: Nov. 20, 2017

(86) PCT No.: PCT/JP2017/041717
§ 371 (c)(1),
(2) Date: Apr. 3, 2019

(87) PCT Pub. No.: WO2018/092909
PCT Pub. Date: May 24, 2018

(65) Prior Publication Data
US 2020/0044378 A1    Feb. 6, 2020

(30) Foreign Application Priority Data

Nov. 21, 2016  (JP) .................................. 2016-226150

(51) Int. Cl.
*H01R 13/24*   (2006.01)
*G01R 1/04*   (2006.01)
(Continued)

(52) U.S. Cl.
CPC ....... *H01R 13/2492* (2013.01); *G01R 1/0466* (2013.01); *G01R 1/06738* (2013.01);
(Continued)

(58) Field of Classification Search
CPC ............ H01R 13/2485; H01R 33/7635; H01R 33/2421; H01R 13/2492; G01R 1/0466
See application file for complete search history.

(56) References Cited

U.S. PATENT DOCUMENTS 4,417,206 A * 11/1983 Stowers ............. G01R 1/06738
                                                       324/72.5
4,438,397 A *  3/1984 Katz .................. G01R 1/06722
                                                       324/72.5
(Continued)

FOREIGN PATENT DOCUMENTS

EP      2 770 332 A1   8/2014
JP      63-101867 U    5/1988
(Continued)

OTHER PUBLICATIONS

International Search Report dated Jan. 30, 2018, in corresponding International Patent Application No. PCT/JP2017/041717.
(Continued)

*Primary Examiner* — Briggitte R. Hammond
(74) *Attorney, Agent, or Firm* — Staas & Halsey LLP

(57) ABSTRACT

An electrical contact and an electric component socket configured to be electrically connected to an electric component, wherein the electrical contact is capable of preventing a defect that a contacting portion of the electrical contact bites into a terminal of the electric component, leaving an indentation or giving rise to a state where burrs are liable to occur. An electrical contact has a contacting portion that comes in contact with a terminal of an electric component, the contacting portion includes a plurality of convex portions provided around a center in a tip portion of the contacting portion, the convex portions have flat portions on an outer circumferential side, and peak-shaped portions extending from the flat portions toward the center to come in contact with the terminal, and the contacting portion (Continued)

includes valley-shaped portions, each valley-shaped portion being formed between the respective convex portions in the plurality of convex portions.

12 Claims, 16 Drawing Sheets

(51) Int. Cl.
*H01R 33/76* (2006.01)
*G01R 1/067* (2006.01)

(52) U.S. Cl.
CPC ..... *H01R 13/2421* (2013.01); *H01R 13/2485* (2013.01); *H01R 33/7635* (2013.01)

(56) References Cited

U.S. PATENT DOCUMENTS

| | | | | |
|---|---|---|---|---|
| 4,571,540 A * | 2/1986 | Stowers | ............. | G01R 1/06738 324/72.5 |
| 4,686,465 A * | 8/1987 | Kruger | ............... | G01R 1/07371 324/756.03 |
| 5,045,780 A * | 9/1991 | Swart | ................. | G01R 1/06722 324/72.5 |
| 5,557,213 A * | 9/1996 | Reuter | ............... | G01R 1/06722 324/755.05 |
| 5,731,710 A * | 3/1998 | Mizuno | ............ | G01R 1/06722 324/72.5 |
| 5,929,521 A | 7/1999 | Wark et al. | | |
| 6,187,658 B1 * | 2/2001 | Chittipeddi | ............. | H01L 24/02 257/E23.02 |
| 6,333,555 B1 * | 12/2001 | Farnworth | ............... | H01L 23/13 257/692 |
| 6,464,511 B1 * | 10/2002 | Watanabe | .......... | G01R 1/07371 439/66 |
| 6,503,089 B2 * | 1/2003 | Saijo | ....................... | G01R 1/045 439/70 |
| 6,737,878 B2 * | 5/2004 | Kagami | ............. | G01R 1/06738 324/755.01 |
| 6,902,410 B2 * | 6/2005 | Watanabe | .............. | G01R 1/045 439/66 |
| 7,381,062 B2 * | 6/2008 | Shimada | ............ | G01R 1/06722 439/66 |
| 7,462,056 B2 * | 12/2008 | Yeh | ......................... | H01R 12/58 439/331 |
| 8,342,872 B2 * | 1/2013 | Suzuki | ................. | G01R 1/0466 439/331 |
| 8,556,639 B2 * | 10/2013 | Ueyama | ............. | H01R 13/2421 439/66 |
| 9,153,890 B2 * | 10/2015 | Warwick | ................ | H01R 13/03 |
| 9,373,900 B2 * | 6/2016 | Yamada | ............ | H01R 4/4863 |
| 9,404,941 B2 * | 8/2016 | Kazama | ............ | G01R 1/06722 |
| 9,472,867 B2 * | 10/2016 | Ueyama | .................. | H01R 4/48 |
| 9,653,833 B2 * | 5/2017 | Suzuki | ................... | G01R 1/073 |
| 9,698,511 B2 * | 7/2017 | Oda | .......................... | C25D 5/12 |
| 10,161,964 B2 * | 12/2018 | Miyagawa | ............. | G01R 1/045 |
| 10,274,517 B2 * | 4/2019 | Hironaka | ............... | G01R 1/067 |
| 2018/0340976 A1 * | 11/2018 | Ishii | .................... | H01L 21/4853 |

FOREIGN PATENT DOCUMENTS

| | | |
|---|---|---|
| JP | 2001-21615 | 1/2001 |
| JP | 2002-357622 | 12/2002 |
| JP | 2003-344449 | 12/2003 |
| JP | 2007-218675 | 8/2007 |
| JP | 2008-241353 | 10/2008 |
| JP | 2009-180549 A | 8/2009 |
| JP | 2014-85207 | 5/2014 |
| WO | 2015/030357 A1 | 3/2015 |

OTHER PUBLICATIONS

International Written Opinion dated Jan. 30, 2018, in corresponding International Patent Application No. PCT/JP2017/041717.
Extended European Search Report dated Jun. 8, 2020, in corresponding European Patent Application No. 17872360.7.

* cited by examiner

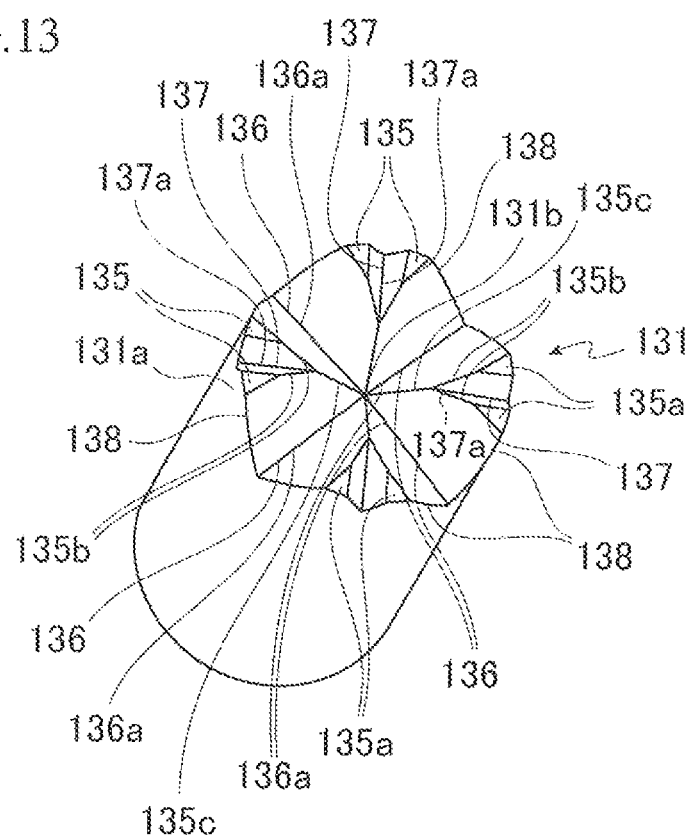

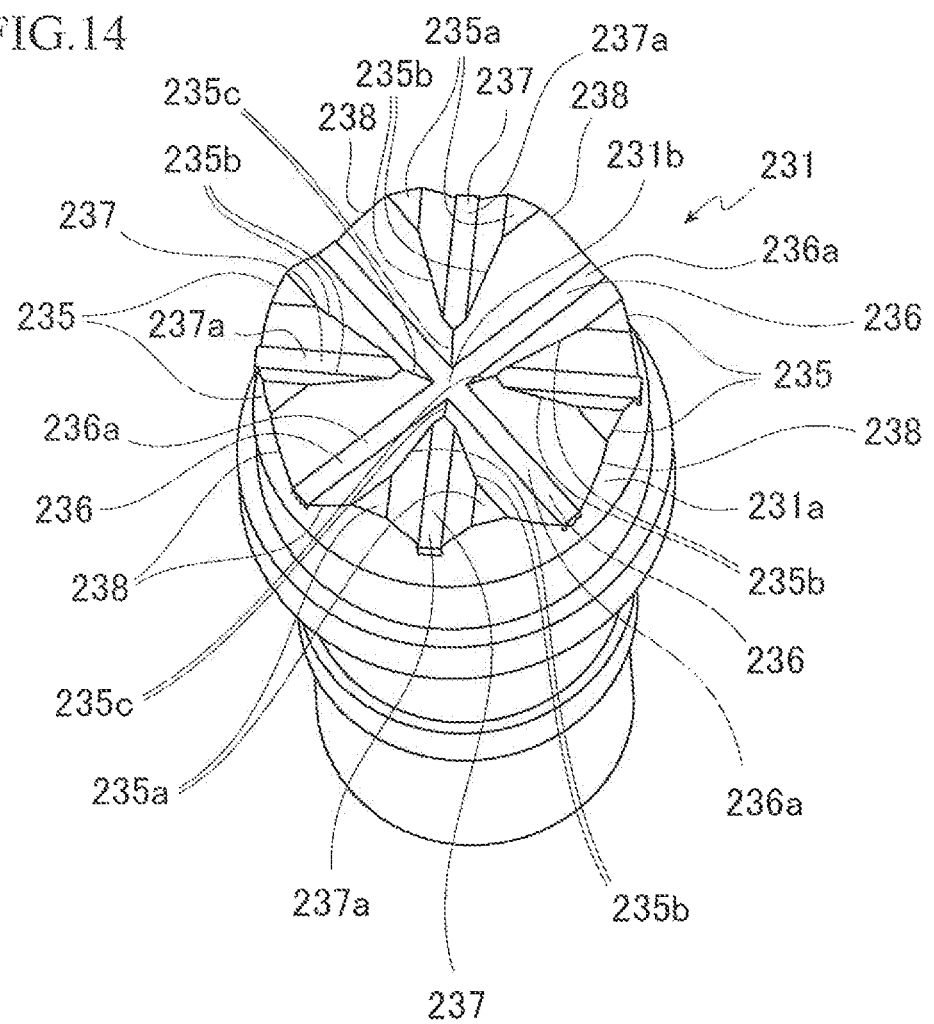

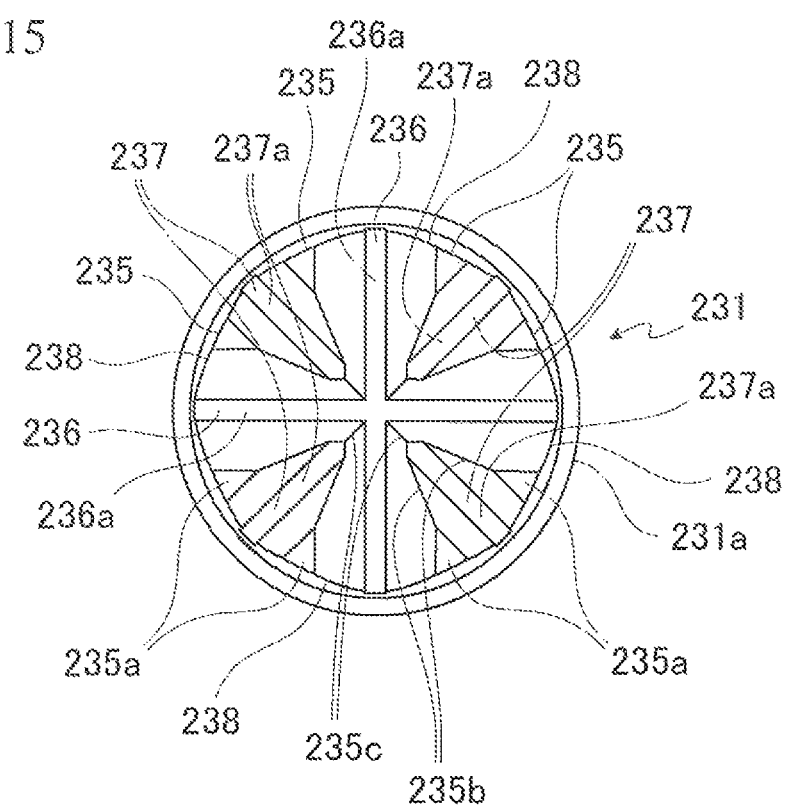

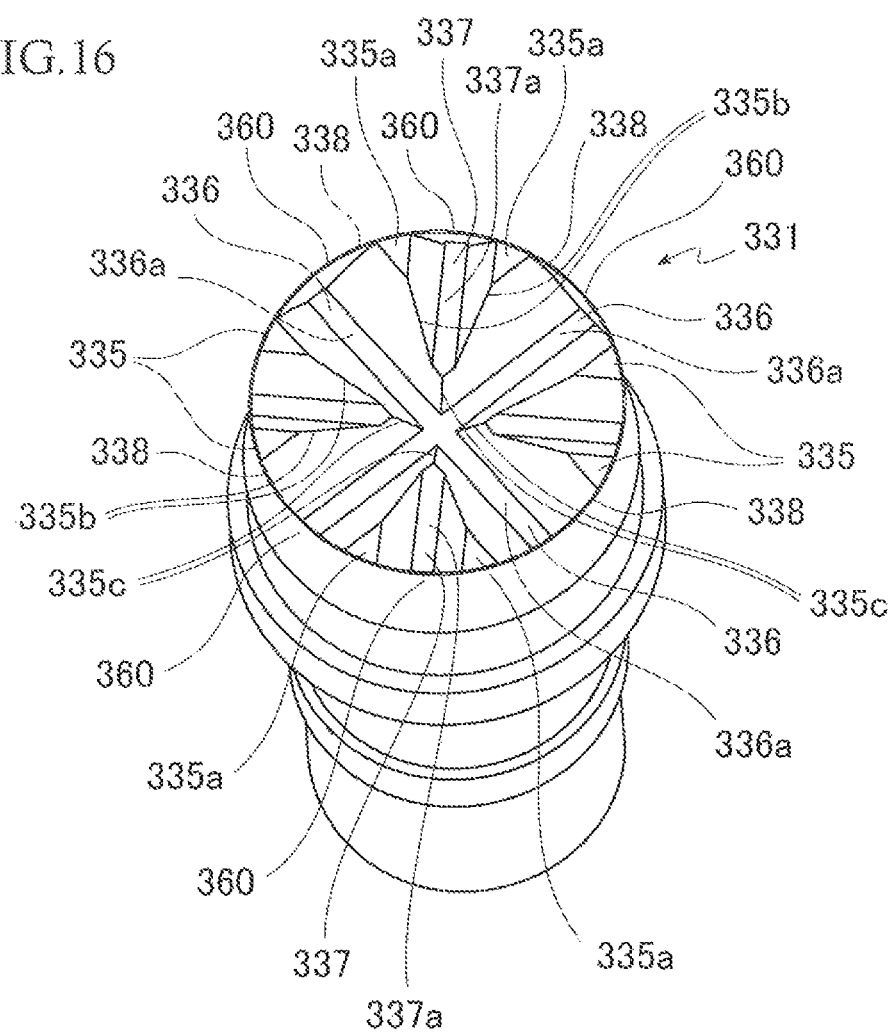

ELECTRICAL CONTACT AND ELECTRIC COMPONENT SOCKET

CROSS-REFERENCE TO RELATED APPLICATIONS

This application is a U.S. National Stage Application which claims the benefit under 35 U.S.C. § 371 of PCT International Patent Application No. PCT/JP2017/041717, filed Nov. 20, 2017, which claims the foreign priority benefit under 35 U.S.C. § 119 of Japanese Patent Application No. 2016-226150, filed Nov. 21, 2016, the contents of which are incorporated herein by reference.

TECHNICAL FIELD

The present invention relates to an electrical contact electrically connected to an electric component such as a semiconductor device (hereinafter referred to as "IC package"), and an electric component socket in which electrical contacts are disposed.

BACKGROUND ART

Heretofore, as this type of electrical contact, a contact pin provided in an IC socket as an electric component socket has been known. This IC socket is disposed on a wiring substrate and configured to store an IC package as an inspection target, and terminals of this IC package are electrically connected to electrodes of the wiring substrate via the contact pins, so that a test such as a continuity test is performed.

Certain contact pins of the above type may come in contact with an IC package having spherical terminals or other similar terminals. Furthermore, among such the contact pins, a contact pin is known such that a contacting portion of the contact pin to come in contact with the spherical terminal of the IC package is formed in a substantially crown shape having a plurality of protruding portions (e.g., see Patent Literature 1).

CITATION LIST

Patent Literature

Patent Literature 1: Japanese Patent Laid-Open No. 2008-241353

SUMMARY OF INVENTION

Technical Problem

However, such a contacting portion formed in a substantially crown shape having a plurality of protruding portions as described above has a problem that, when a position of a spherical terminal to the contacting portion shifts, the protruding portions of the contacting portion bite into the spherical terminal, leaving indentations or giving rise to a state where burrs are liable to occur.

To solve the problem, an object of the present invention is to provide an electrical contact (a contact pin) and an electric component socket (an IC socket) configured to be electrically connected to an electric component (an IC package) by a contacting portion coming into contact with a terminal, wherein the electrical contact and the electric component socket are capable of preventing a defect that the contacting portion of the electrical contact bites into the terminal of the electric component, leaving an indentation or giving rise to a state where burrs are liable to occur.

Solution to Problem

To achieve such an object, in an aspect of the invention according to claim 1, an electrical contact includes a contacting portion that comes in contact with a terminal of an electric component, the contacting portion includes a plurality of convex portions provided around a center of a tip portion of the contacting portion, the convex portions have flat portions on an outer circumferential side, and peak-shaped portions extending from the flat portions toward the center to come in contact with the terminal, and the contacting portion has a plurality of valley-shaped portions, each valley-shaped portion being formed between respective convex portions of the plurality of convex portions.

In the aspect of the invention according to claim 2, in addition to the configuration according to claim 1, the plurality of valley-shaped portions include a combination of the valley-shaped portions having different valley depths In the aspect of the invention according to claim 3, in addition to the configuration according to claim 2, each valley-shaped portion includes a valley bottom portion, and at least a part of the valley bottom portion has a flat strip shape.

In the aspect of the invention according to claim 4, in addition to the configuration according to claim 3, the plurality of valley-shaped portions include a combination of the valley-shaped portions including the valley bottom portions having a flat shape and a V-shape.

In the aspect of the invention according to claim 5, in addition to the configuration according to any one of claims 1 to 4, the electrical contact has an outer wall portion that closes an outer circumferential side of each of the valley-shaped portions.

In another aspect of the invention according to claim 6, there is provided an electric component socket including a socket main body disposed on a wiring substrate and having a storage portion in which an electric component is stored, and the electrical contact according to any one of claims 1 to 4 disposed in the socket main body to come in contact with each of terminals provided in the electric component.

Advantageous Effects of Invention

According to the aspect of the invention of claim 1, a contacting portion of an electrical contact includes a plurality of convex portions having flat portions on an outer circumferential side, and peak-shaped portions extending from the flat portions toward the center to come in contact with a terminal, so that even when a position of the terminal to the contacting portion shifts, the terminal comes in contact with the flat portions on the outer circumferential side of the convex portions. Consequently, the contacting portion does not bite into the terminal, and does not leave any indentations, and can give rise to a state where burrs are hard to occur.

According to the aspect of the invention of claim 2, a plurality of valley-shaped portions include a combination of the valley-shaped portions having small and large valley depths, so that a large number of peak-shaped portions that come in contact with the terminal can be formed in a small diameter of the electrical contact.

According to the aspect of the invention of claim 3, a valley bottom portion of each valley-shaped portion between the respective convex portions has a flat strip shape. Consequently, as compared with a valley-shaped portion having a valley bottom portion that is not flat, a waste and a dreg of the terminal which might be generated by the contact with the terminal can be more easily removed.

According to the aspect of the invention of claim 4, the plurality of valley-shaped portions include a combination of the valley-shaped portions including the valley bottom portions having a flat shape and a V-shape. Consequently, a waste and a dreg of the terminal can be easily removed through the valley-shaped portions having the flat valley bottom portions. Furthermore, the valley-shaped portions having the V-shaped valley bottom portions are appropriately combined, so that a mountain shape and tilt angle of each convex portion can be adjusted.

According to the aspect of the invention of claim 5, the electrical contact has an outer wall portion that closes an outer circumferential side of each of the valley-shaped portions, so that the generated waste and dreg of the terminal can be obstructed by the outer wall portion and prevented from leaking to the outside. As a result, the waste and dreg of the terminal can be prevented from being scattered to and adversely affecting an electric component socket, a wiring substrate and the like.

According to an aspect of the invention of claim 6, an electric component socket has the electrical contact according to any one of claims 1 to 4. Consequently, even when a position of a terminal to a contacting portion shifts, the terminal comes in contact with flat portions of convex portions on an outer circumferential side. Therefore, the contacting portion does not bite into the terminal, and does not leave any indentations. There can be provided the electric component socket in which burrs are hard to occur.

BRIEF DESCRIPTION OF DRAWINGS

FIG. 13 is an enlarged perspective view of a contacting portion of a contact pin according to Embodiment 2 of the present invention.

FIG. 14 is an enlarged perspective view of a contacting portion of a contact pin according to Embodiment 3 of the present invention.

FIG. 15 is an enlarged plan view of the contacting portion of the contact pin according to Embodiment 3.

FIG. 16 is an enlarged perspective view of a contacting portion of a contact pin according to Embodiment 4 of the present invention.

DESCRIPTION OF EMBODIMENTS

Hereinafter, embodiments of the present invention will be described.

Embodiment 1 of Invention

FIG. 1 to FIG. 12 show Embodiment 1 of the present invention.

Figure 1:
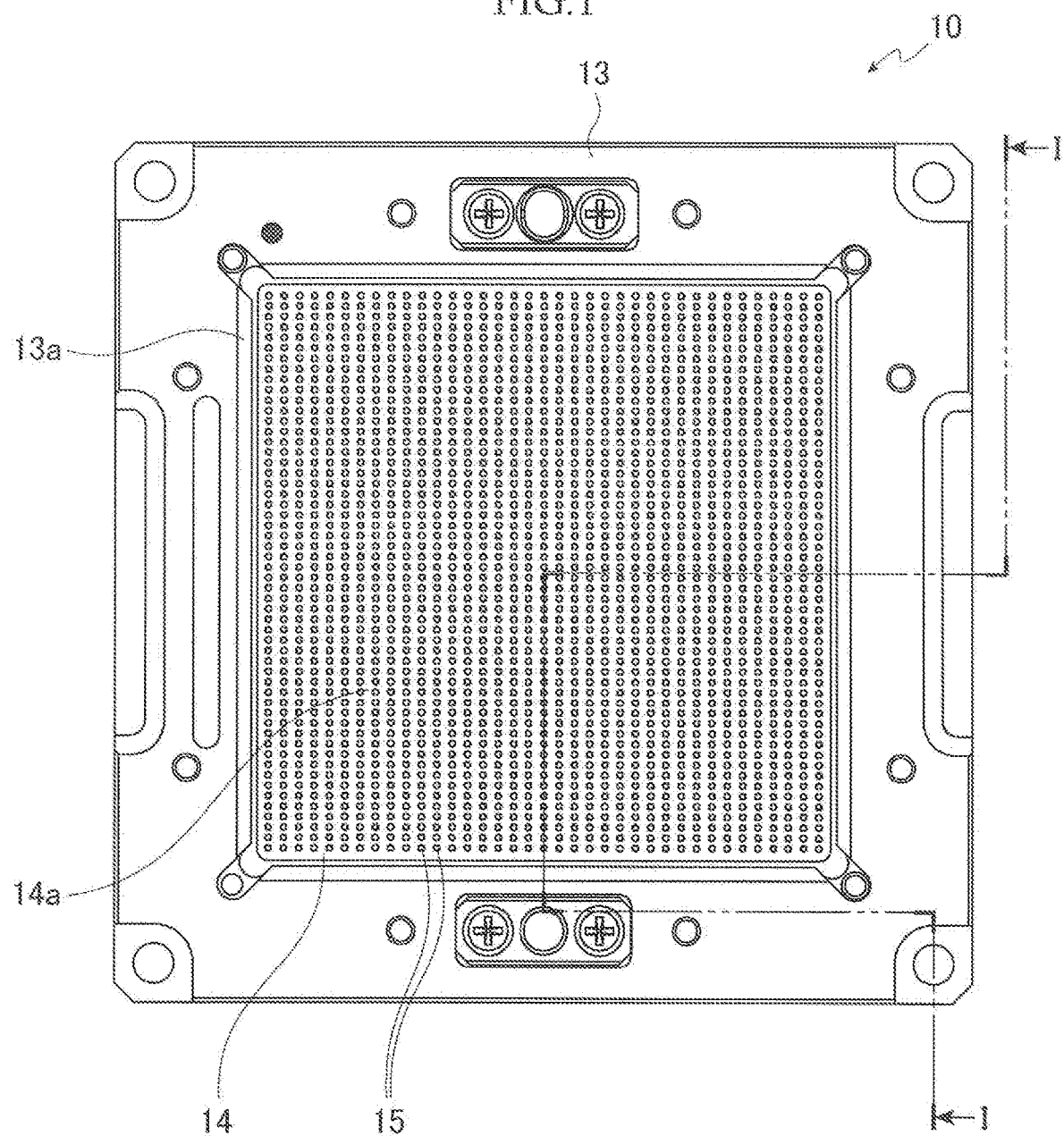
FIG. 1 is a plan view of an IC socket according to Embodiment 1 of the present invention.
Figure 2:
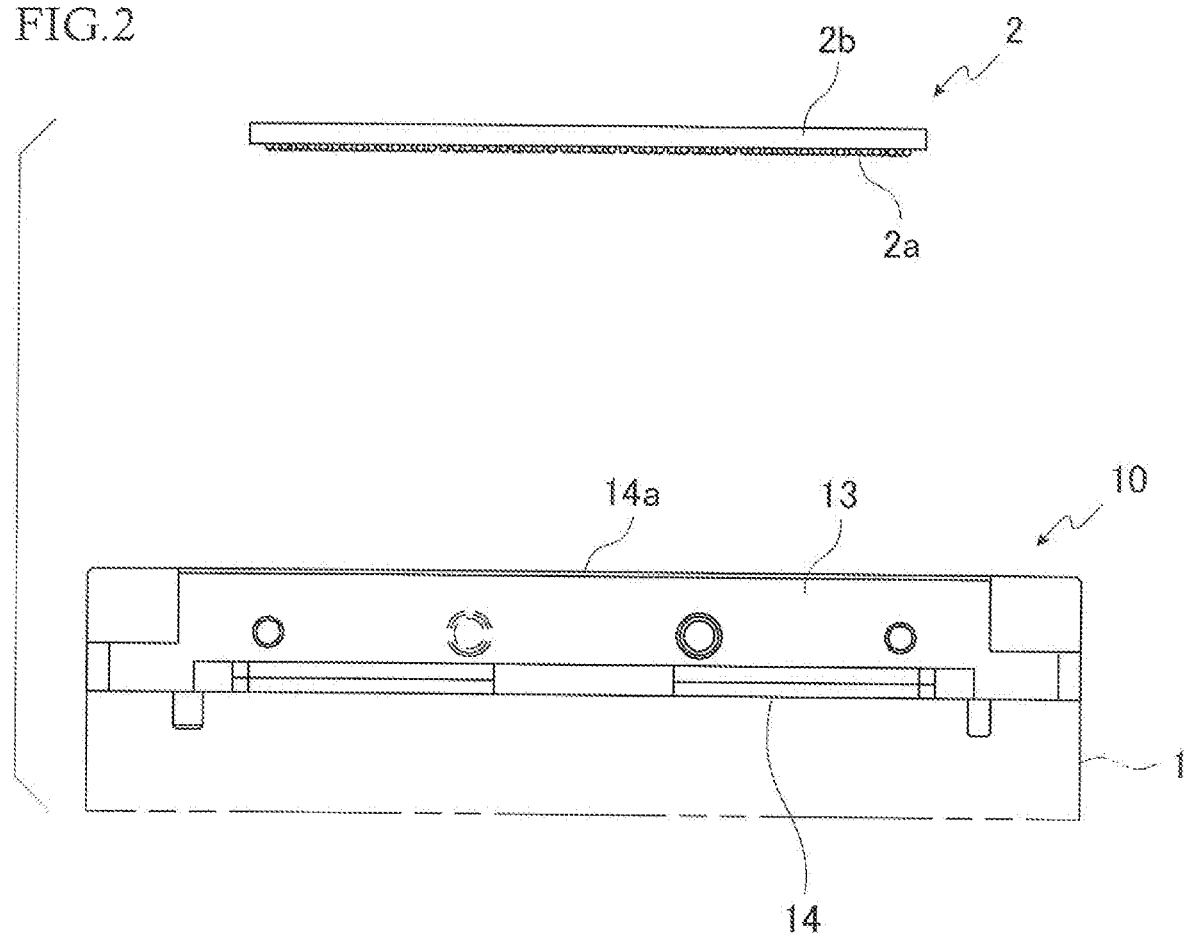
FIG. 2 is a front view showing that an IC package is stored in the IC socket according to Embodiment 1.

An IC socket 10 as "an electric component socket" of the present embodiment is, as shown in FIG. 1 and FIG. 2, fixed on a wiring substrate 1, stores an IC package 2 as "an electric component" in an upper part of the socket, and is configured to electrically connect electrodes (not shown) of the wiring substrate 1 to solder balls 2a as "terminals" of the IC package 2. For example, the socket is for use in a test device or the like for a continuity test such as a burn-in test or a reliability test to the IC package 2.

Figure 11:
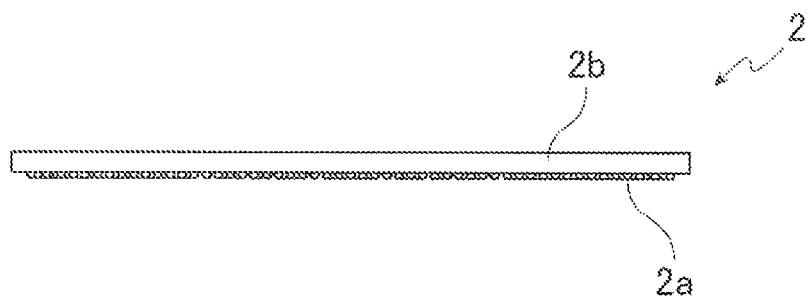
FIG. 11 is a front view of the IC package for use in Embodiment 1.
Figure 12:
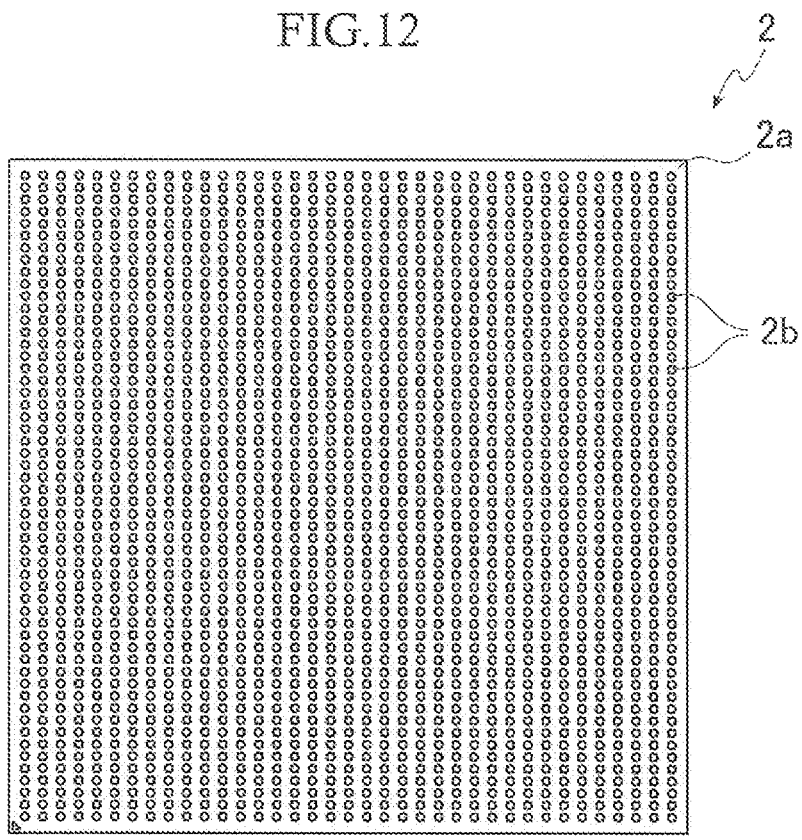
FIG. 12 is a bottom view of the IC package for use in Embodiment 1.

First, the IC package 2 of the present embodiment will be described with reference to FIG. 11 and FIG. 12. As shown in FIG. 11 and FIG. 12, the IC package 2 of the present embodiment has a package main body 2b having a substantially square shape in planar view, and a plurality of spherical solder balls 2a are provided in a matrix manner on a lower surface of the package main body 2b.

Next, the IC socket 10 of the present embodiment will be described with reference to FIG. 1 to FIG. 10. The IC socket 10 of the present embodiment includes a frame-shaped guide member 13 attached onto a socket main body 14. Furthermore, the socket main body 14 has an upper plate 11 and a lower plate 12.

Additionally, the socket main body 14 includes contact pins 15 as a plurality of "electrical contacts" disposed to extend through the socket main body in a vertical direction, and the plurality of contact pins 15 are arranged in a matrix manner in the socket main body 14. In addition, the upper plate 11 and the lower plate 12 of the socket main body 14 are fixed with fixing screws (not shown), and are positioned with positioning pins (not shown) on the wiring substrate 1. Furthermore, a guide portion 13a is disposed on an inner side of the frame shape of the guide member 13, and is formed to tilt inwardly and downwardly so that the IC package 2 is guided.

In addition, a portion above the upper plate 11 in the socket main body 14 constitutes a storage portion 14a to store the IC package 2 guided from upside by the guide portion 13a of the guide member 13.

In the present embodiment, an arrangement pitch of the solder balls 2a of the IC package 2 is the same as an arrangement pitch of the electrodes of the wiring substrate 1 which are electrically connected to the solder balls 2a, and an arrangement pitch of the contact pins 15 is the same as the above arrangement pitch.

Figure 6:
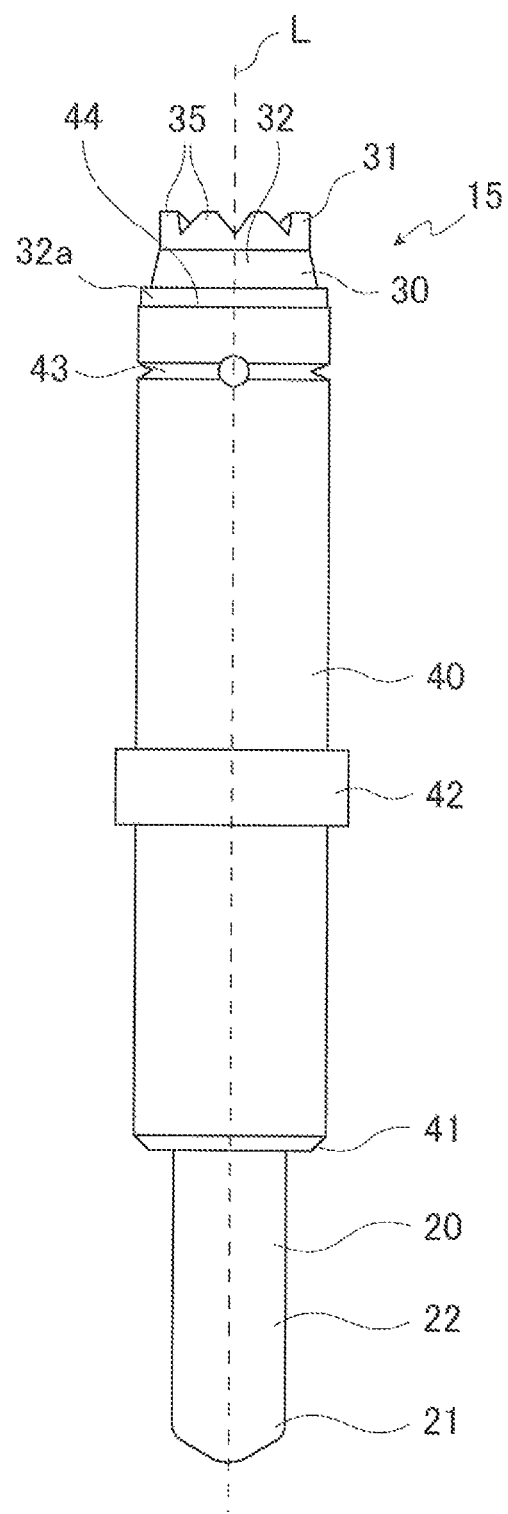
FIG. 6 is an enlarged view of a contact pin in the IC socket according to Embodiment 1.
Figure 7:
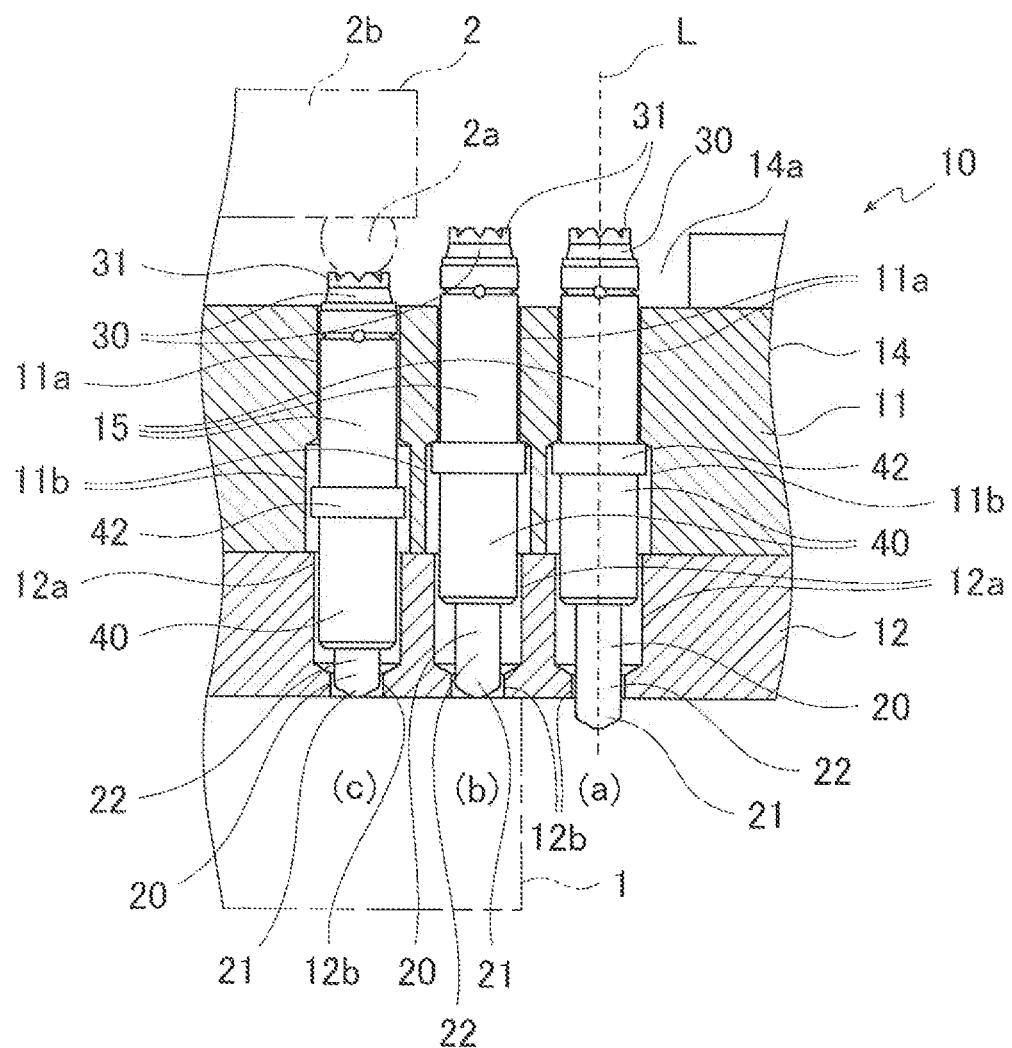
FIG. 7 is an enlarged cross-sectional view showing that the contact pins are arranged in the IC socket according to Embodiment 1.
Figure 8:
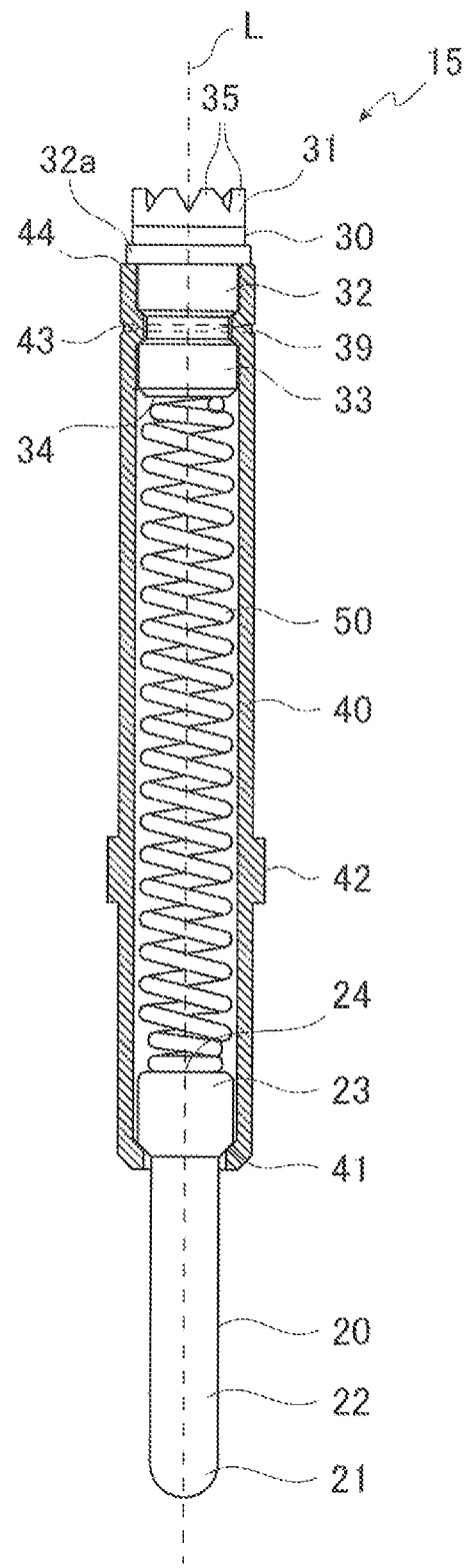
FIG. 8 is an enlarged cross-sectional view showing the contact pin according to Embodiment 1.

As shown in FIG. 6 to FIG. 8, each contact pin 15 includes, along a longitudinal axial line L, a first plunger 20 having, at a tip of the plunger, a first contacting portion 21 that electrically comes in contact with the electrode of the wiring substrate 1; a second plunger 30 having, at a tip of the plunger, a second contacting portion 31 as "a contacting portion" that electrically comes in contact with the solder ball 2a of the IC package 2; and a tubular member 40 that is continuous between the first plunger 20 and the second plunger 30. In the tubular member 40, a coil spring 50 is stored which urges the first plunger 20 and the second plunger 30 to be away from each other along the axial line L.

The tubular member 40 is made of a material having conductivity, and is, as shown in FIG. 6 to FIG. 8, inserted into a lower-side upper through hole 12a provided in the lower plate 12, and an upper-side upper through hole 11a and an upper-side lower through hole 11b provided in the upper plate 11, so that the tubular member can slide in the through holes 11a, 11b and 12a. Furthermore, an enlarged diameter portion 42 is formed in a part of an outer side of the tubular member 40. The enlarged diameter portion 42 is inserted into the upper-side lower through hole 11b so that the enlarged diameter portion 42 can slide in a direction (an upward-downward direction) along the axial line L in the upper-side lower through hole 11b. Furthermore, the enlarged diameter portion 42 cannot be inserted into the upper-side upper through hole 11a and the lower-side upper through hole 12a, but the part of the tubular member 40 other than the enlarged diameter portion 42 is formed in such a width that the part can be inserted into the through holes. Consequently, an upper end and a lower end of the upper-side lower through hole 11b serve as stoppers, and the enlarged diameter portion 42 can slide only in the upper-side lower through hole 11b.

The first plunger 20 is made of, for example, palladium alloy, and includes a first protruding portion 22 including, at a tip of the portion, the first contacting portion 21 having a tapered shape and a protruding region on the longitudinal axial line L of the contact pin 15 to come in contact with the electrode of the wiring substrate 1; and a first inserting portion 23 that is thicker than the first protruding portion 22. In this plunger, the first inserting portion 23 is stored in the tubular member 40 to be slidably in contact with an interior of the tubular member, and movement of the first plunger 20 in a protruding direction (a downward direction) is regulated by a first locking portion 41 formed in a lower end of the tubular member 40.

Furthermore, a first receiving portion 24 that locks the coil spring 50 is formed in a substantially flat shape integrally with an end of the first inserting portion 23. Additionally, the first protruding portion 22 is slidably inserted into a lower-side lower through hole 12b of the lower plate 12. In addition, as shown in FIG. 7(b), the first contacting portion 21 formed in a convex curved-surface shape at the tip of the first protruding portion 22 comes in contact with the electrode of the wiring substrate 1, thereby electrically connecting to the wiring substrate 1.

The second plunger 30 is made of, for example, palladium alloy, and includes, as shown in FIG. 8, a second protruding portion 32 having, at a tip of the portion, the second contacting portion 31 (a shape of the portion will be described later) having a predetermined shape that comes in contact with the solder ball 2a of the IC package 2; a small diameter portion 39 having a diameter smaller than a diameter of the second protruding portion 32, and a second inserting portion 33 formed to have the same diameter as the diameter of the second protruding portion 32, these portions being continuously and integrally formed. Furthermore, the second plunger 30 includes a flange portion 32a at a middle position of the second protruding portion 32 in a direction along the axial line L. In this plunger, the flange portion 32a abuts on an upper end 44 of the tubular member 40 from upside, and the small diameter portion 39 is fitted in a fitting portion 43 caulked and formed in a small diameter in the vicinity of the upper end 44 of the tubular member 40, so that the second plunger 30 is held in a state where movement of the second plunger in the direction along the axial line L (the upward-downward direction) is regulated by the tubular member 40.

Figure 9:
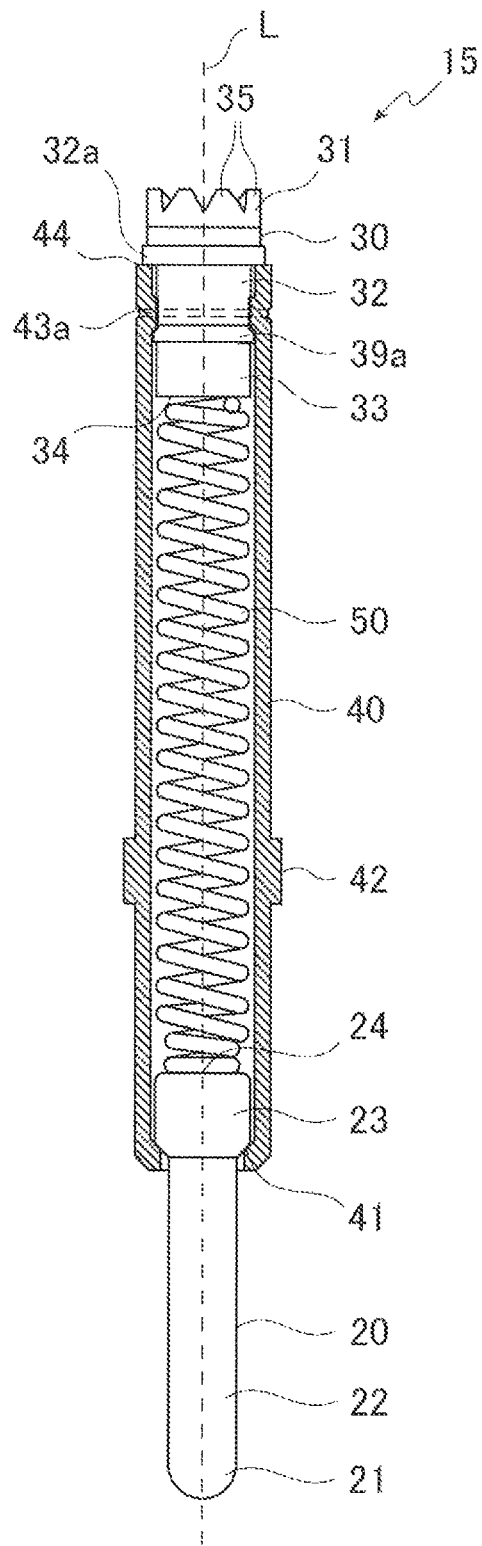
FIG. 9 is an enlarged cross-sectional view showing a modification of the contact pin according to Embodiment 1.

Note that as a configuration to hold the second plunger 30 in the state where the movement of the second plunger 30 in the axial line L direction (the upward-downward direction) is regulated by the tubular member 40, as shown in FIG. 9, there may be used a configuration that does not have the small diameter portion 39 in the second plunger 30, and instead has a large diameter portion 39a between the second protruding portion 32 and the second inserting portion 33 that are formed to have the same diameter. In this configuration, the flange portion 32a abuts on the upper end 44 of the tubular member 40 from the upside, a reduced diameter portion 43a is formed by reducing a diameter of the tubular member 40 to a smaller diameter right above the large diameter portion 39a, and the large diameter portion 39a abuts on the reduced diameter portion 43a from downside, so that the second plunger 30 is held in the tubular member 40.

Furthermore, at an end of the second inserting portion 33, a second receiving portion 34 that locks the coil spring 50 is formed in a substantially flat shape. Additionally, a part of the second protruding portion 32, which is upper than the flange portion 32a, protrudes up from the upper plate 11, and the second contacting portion 31 can abut on the solder ball 2a of the IC package 2 stored in the storage portion 14a.

Figure 10:
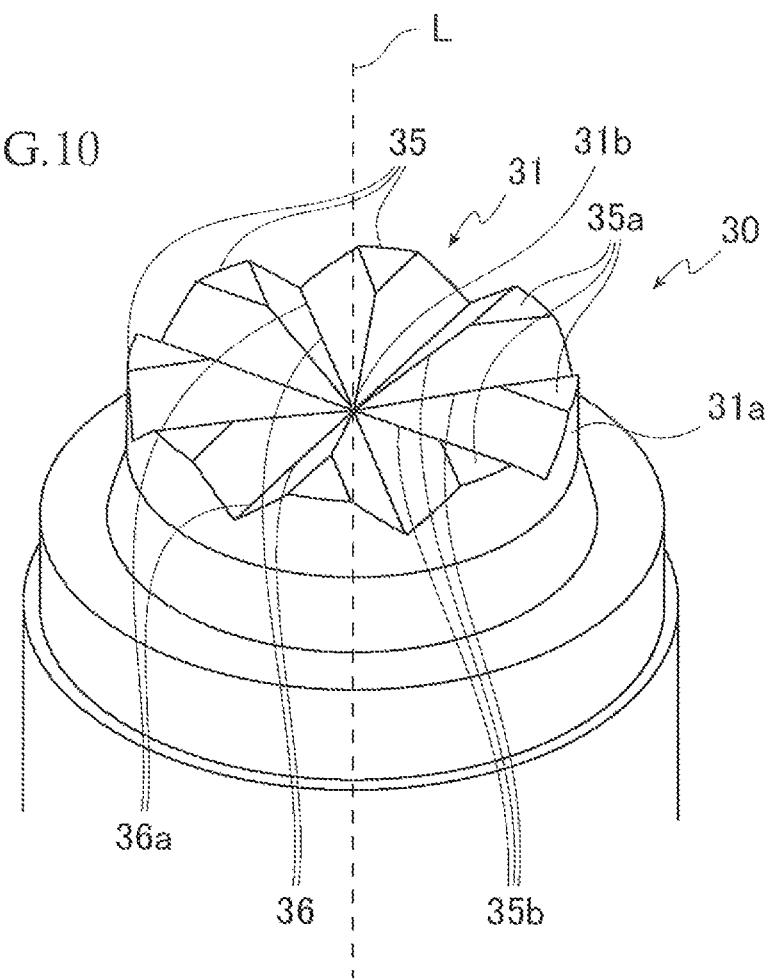
FIG. 10 is an enlarged perspective view of a contacting portion of the contact pin according to Embodiment 1.

Additionally, as shown in FIG. 7(c), the second contacting portion 31 of the second plunger 30 comes in contact with a certain range of the solder ball 2a, to electrically connect the IC package 2 to the IC socket 10. As shown in FIG. 10, the second contacting portion 31 is formed to have a plurality of (eight herein) convex portions 35.

The plurality of convex portions 35 are formed in a mountain shape around a center 31b of a tip surface that faces the solder ball 2a in a tip portion 31a of the second contacting portion 31 that comes in contact with the solder ball 2a. As shown in FIG. 10, the eight convex portions are arranged at substantially equal intervals in a periphery of a substantially round shape in planar view. Furthermore, this convex portion 35 is formed so that a protruding height of the portion increases from an inner circumferential side toward an outer circumferential side, and a tip side of the outer circumferential of the convex portion is a flat portion 35a formed by a plane (a substantially horizontal plane) that is perpendicular to the axial line L.

Furthermore, each of the flat portions 35a of the plurality of convex portions 35 is formed in a substantially fan shape, and a peak-shaped portion 35b is formed to smoothly tilt and lower from a central portion of the substantially fan shape toward the center 31b of the second contacting portion 31. The peak-shaped portions 35b come in contact with the solder ball 2a, thereby electrically connecting the IC package 2 to the IC socket 10.

Furthermore, a valley-shaped portion 36 is formed between the respective convex portions 35. A valley bottom portion 36a of the valley-shaped portion 36 of the present embodiment is formed in a substantially V-shape in cross-sectional view, and four linear valley bottom portions 36a are formed to intersect at the center 31b of the second contacting portion 31.

Next, description will be made as to a manufacturing method of the contact pin 15 including the second plunger 30 having the second contacting portion 31 in this way with reference to FIG. 8.

First, the tubular member 40 including the enlarged diameter portion 42 formed in an outer part of a tubular shape is formed, and the coil spring 50 having a predetermined shape is formed. At this time, the tubular member 40 is not provided with the first locking portion 41 and the fitting portion 43, and is formed in a tubular shape having the same diameter in the axial line L direction.

Furthermore, there is formed the first plunger 20 including the first protruding portion 22 having the first contacting portion 21, and the first inserting portion 23 having the first receiving portion 24 and being thicker than the first protruding portion 22.

Additionally, a tip portion of a metal rod member (not shown) having a predetermined shape is processed. In consequence, as shown in FIG. 10, the second contacting portion 31 having the eight convex portions 35 is formed.

In addition, during the processing, the flange portion 32a is formed on the metal rod member. Subsequently, the small diameter portion 39 is formed by cutting, pressing and the like, and the metal rod member is processed, for example, by cutting the member in a predetermined length, to form the second plunger 30.

Afterward, the first inserting portion 23 of the first plunger 20 is inserted into the tubular member 40 from the downside, and the lower end of the tubular member 40 is, for example, caulked, to form the first locking portion 41 having a smaller diameter than the first inserting portion 23 and having a larger diameter than the first protruding portion 22, and the first plunger 20 is slidably held in the tubular member 40 in the axial line L direction.

Next, the second inserting portion 33 of the second plunger 30 is inserted into the tubular member 40 from the upside, so that the flange portion 32a abuts on the upper end 44 of the tubular member 40 from the upside. Then, the tubular member 40 at a position corresponding to the small diameter portion 39 of the second plunger 30 is caulked or otherwise narrowed down, to form the fitting portion 43 in the tubular member 40.

Consequently, the flange portion 32a and the small diameter portion 39 are held by the upper end 44 and the fitting portion 43 so as not to move in the axial line L direction, and the contact pin 15 is formed.

Note that as the configuration to hold the second plunger 30 in the state where the movement of the second plunger in the axial line L direction (the upward-downward direction) is regulated by the tubular member 40, as shown in FIG. 9, there is formed the configuration that does not have the small diameter portion 39 in the second plunger 30, and instead has the large diameter portion 39a between the second protruding portion 32 and the second inserting portion 33 that are formed to have the same diameter. This configuration is formed by changing a part of the above manufacturing method as follows.

That is, when the second plunger 30 is formed, the flange portion 32a and the large diameter portion 39a are formed on a metal rod member during processing.

Furthermore, the second inserting portion 33 of the second plunger 30 is inserted into the tubular member 40 from the upside of the tubular member, and the flange portion 32a abuts on the upper end 44 of the tubular member 40 from the upside. Then, a portion of the tubular member 40 which corresponds to a position right above the large diameter portion 39a of the second plunger 30 is caulked or otherwise narrowed down, to form the reduced diameter portion 43a in the tubular member 40. Consequently, the flange portion 32a and the large diameter portion 39a are held by the upper end 44 and the reduced diameter portion 43a so that the second plunger does not move in the axial line L direction, and the contact pin 15 is formed.

Next, description will be made as to an operation of the IC socket 10 including the contact pin 15 having the second plunger 30 in which the second contacting portion 31 is formed in this way.

When this IC socket 10 is used, the plurality of contact pins 15 are fitted in the socket main body 14, and as shown in FIG. 7(a), the contact pins are arranged so that the first contacting portion 21 of each first plunger 20 protrudes downwards and the second contacting portion 31 of each second plunger 30 protrudes upwards. Then, the IC socket 10 is positioned and fixed to the wiring substrate 1, and as shown in FIG. 7(b), the first contacting portion 21 of the first plunger 20 is brought into contact with each electrode of the wiring substrate 1. At this time, in each tubular member 40, the coil spring 50 is compressed by the first receiving portion 24 of the first inserting portion 23 of the first plunger 20, and as a result, the enlarged diameter portion 42 of the tubular member 40 is pushed onto the upper end of the upper-side lower through hole 11b.

Figure 4:
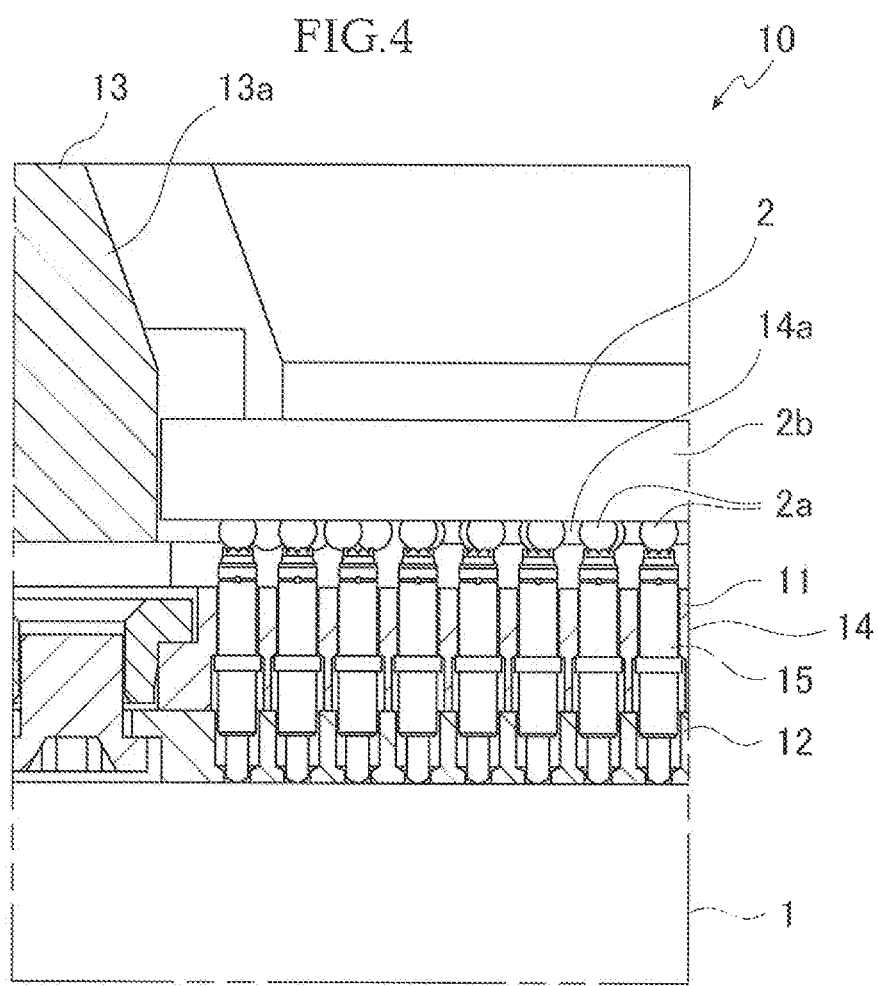
FIG. 4 is an enlarged cross-sectional view of B part of FIG. 3, showing that the IC package is stored.
Figure 5:
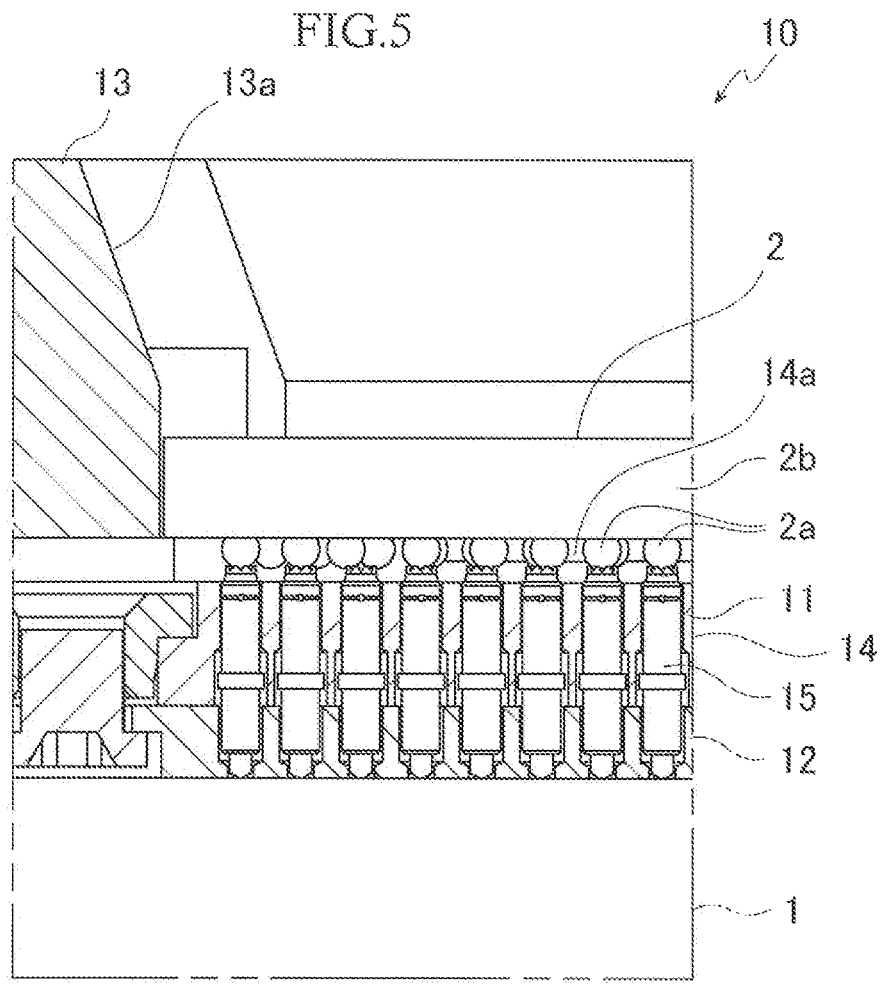
FIG. 5 is an enlarged cross-sectional view showing that the IC package is pushed downward from a state of FIG. 4.

Afterward, as shown in FIG. 4, the IC package 2 is stored in the storage portion 14a, and the solder balls 2a are brought into contact with the second contacting portions 31. In this state, when a pressing jig (not shown) or the like is lowered to push the IC package 2 downwards, the peak-shaped portions 35b of the plurality of convex portions 35 in the second contacting portions 31 of the second plungers 30 are pushed by the solder balls 2a. As shown in FIG. 5 and FIG. 7(c), the second plungers 30 are pushed downwards. Then, each coil spring 50 is compressed by the first plunger 20 and the second plunger 30, and the coil spring 50 urges the first contacting portion 21 of the first plunger 20 and the second contacting portion 31 of the second plunger 30 in a direction away from each other, so that with an appropriate contact pressure, the IC socket is in contact and is electrically connected between the electrodes of the wiring substrate 1 and the solder balls 2a of the IC package 2. In this state, the continuity test, such as the burn-in test, is performed on the IC package 2.

In this way, the peak-shaped portions 35b of the plurality of convex portions 35 of the second contacting portion 31 abut on the solder ball 2a, thereby achieving the electrical connection between the IC package 2 and the contact pin 15. Consequently, the second contacting portion 31 does not bite into the solder ball 2a and does not leave any indentations, and can give rise to a state where burrs are hard to occur.

Furthermore, according to the contact pin 15 of the present embodiment, the eight convex portions 35 having the peak-shaped portions 35b are arranged at substantially equal intervals, so that the solder ball 2a can come in contact with the peak-shaped portions 35b more stably than in a conventional contact pin having four protruding portions.

Here, even when a position of the solder ball 2a to the second contacting portion 31 shifts, the flat portions 35a formed on the outer circumferential sides of the peak-shaped portions 35b in the convex portions 35 come in contact with the solder ball 2a. Consequently, for example, a pointed tip of the contacting portion does not pierce the solder ball 2a, and the solder ball is not damaged. The second contacting portion 31 does not bite into the solder ball 2a and does not leave any indentations, and can give rise to the state where the burrs are hard to occur. As a result, the contact pin 15 with good yield can be obtained.

Embodiment 2 of Invention

FIG. 13 shows Embodiment 2 of the present invention. Note that the embodiment of the present invention is similar to Embodiment 1 described above except matters described below. Therefore, matters except differences from Embodiment 1 described above are denoted with the same reference signs, and description is omitted.

In the present embodiment, the second contacting portion 31 of the second plunger 30 of the contact pin 15 in Embodiment 1 described above is changed to a second contacting portion 131 having such a different tip shape as shown in FIG. 13. Hereinafter, the second contacting portion 131 in the present embodiment will be described.

As shown in FIG. 13, the second contacting portion 131 of the present embodiment has a plurality of (eight herein) convex portions 135 in the same manner as in Embodiment 1 described above, but is different in a shape of each convex portion.

Figure 3:
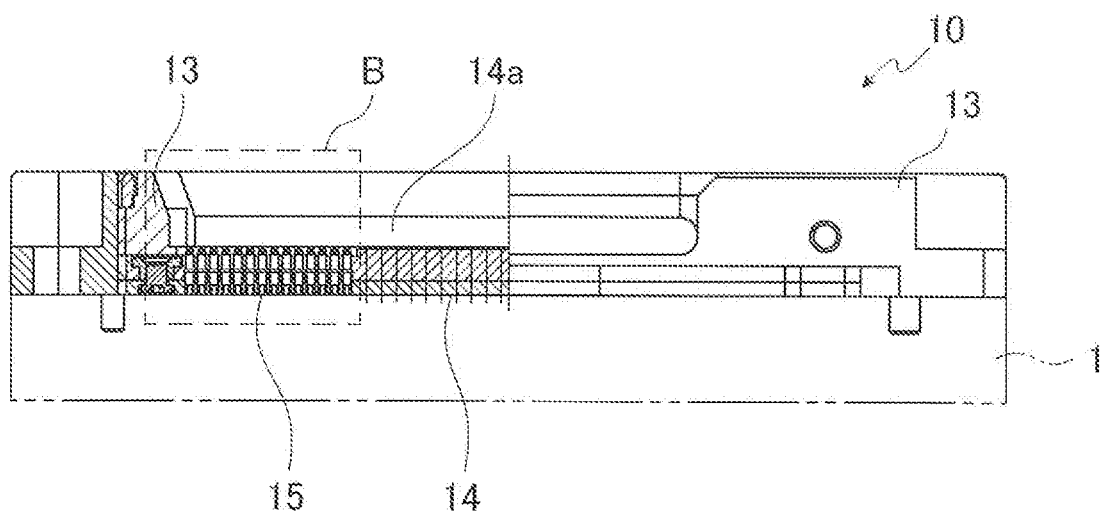
FIG. 3 is a cross-sectional view taken along I-I line of FIG. 1.

The plurality of convex portions 135 of the present embodiment are formed in a mountain shape around a center 131b of a tip surface facing a solder ball 2a, in a tip portion 131a of the second contacting portion 131 that comes in contact with the solder ball 2a. As shown in FIG. 3, a pair of two convex portions is disposed in each of four regions provided at substantially equal intervals in a periphery of a round shape in planar view. Each of the eight convex portions 135 is formed so that a tip side of each of four protruding shape portions 138 provided at substantially equal intervals is further divided into two portions. Furthermore, this convex portion 135 is formed so that a protruding height of the portion increases from an inner circumferential side toward an outer circumferential side, and a tip side of the convex portion on the outer circumferential side is a flat portion 135a formed by a plane (a substantially horizontal plane) that is perpendicular to an axial line L.

Furthermore, each of the flat portions 135a of the plurality of convex portions 135 is formed in a substantially fan shape, and a first peak-shaped portion 135b is formed to smoothly tilt and lower from a central portion of the substantially fan shape toward the center 131b of the second contacting portion 131. Additionally, a second peak-shaped portion 135c is formed to smoothly tilt and lower from an end on a center 131b side of the first peak-shaped portion 135b to the center 131b of the second contacting portion 131.

One first peak-shaped portion 135b is formed in each of the convex portions 135, and hence eight first peak-shaped portions are formed in total, and two first peak-shaped portions 135b are connected in a middle of the second contacting portion 131 toward the center 131b. Furthermore, the second peak-shaped portion 135c is formed to extend from a region where the two first peak-shaped portions 135b are connected, to the center 131b of the second contacting portion 131. One second peak-shaped portion is formed to two convex portions 135, and hence four second peak-shaped portions 135c are formed in total so that a tilt angle of the second peak-shaped portion is larger than an angle of the first peak-shaped portion 135b. Then, both or either of the first peak-shaped portion 135b and the second peak-shaped portion 135c comes in contact with the solder ball 2a, thereby electrically connecting an IC package 2 to an IC socket 10.

A first valley-shaped portion 136 and a second valley-shaped portion 137 are alternately provided between the respective convex portions 135. In the present embodiment, the first valley-shaped portion 136 is provided between two of the four protruding shape portions 138 provided at substantially equal intervals, and the second valley-shaped portion 137 is provided between two convex portions 135 in each of the four protruding shape portions 138.

Furthermore, in the first valley-shaped portion 136 and the second valley-shaped portion 137 of the present embodiment, both a first valley bottom portion 136a and a second valley bottom portion 137a are formed in a substantially V-shape in cross-sectional view.

Additionally, two linear first valley bottom portions 136a are formed to intersect at the center 131b of the second contacting portion 131. In addition, the second valley-shaped portion 137 is linearly formed to the outer circumferential side from a region of a predetermined length away from the center 131b toward the outer circumferential side on a surface that is shallower than the first valley-shaped portion 136 having a depth from a tip of the second contacting portion 131, in the plane (the substantially horizontal plane) that is perpendicular to the axial line L in the second contacting portion 131.

That is, the first valley bottom portion 136a in the present embodiment is formed at a deep position from the tip of the second contacting portion 131, and the second valley bottom portion 137a is formed at a shallow position from the tip of the second contacting portion 131, so that the valley bottom portions 136a and 137a have a difference in level between the portions.

Next, description will be made as to an operation of the IC socket 10 including the contact pin 15 having the second plunger 30 in which the second contacting portion 131 is formed. Note that description similar to the above description of Embodiment 1 is omitted.

According to the contact pin 15 of the present embodiment, a set of two convex portions 135 having the first peak-shaped portions 135b is disposed in each of four regions provided at substantially equal intervals. Therefore, the solder ball 2a can be brought into contact with the first peak-shaped portion 135b and the second peak-shaped portion 135c more stably by the contact pin than by a conventional contact pin having four protruding portions.

Furthermore, when the IC package 2 is stored in a storage portion 14a and even when a position of the solder ball 2a to the second contacting portion 131 shifts, the flat portion 135a formed on the outer circumferential side of the first peak-shaped portion 135b in the convex portion 135 comes in contact with the solder ball 2a. Consequently, for example, a pointed tip of the contacting portion does not pierce the solder ball 2a, and the solder ball is not damaged. The second contacting portion 131 does not bite into the solder ball 2a and does not leave any indentations, and can give rise to a state where burrs are hard to occur. As a result, the contact pin 15 with good yield can be obtained.

Embodiment 3 of Invention

FIG. 14 and FIG. 15 show Embodiment 3 of the present invention. Note that the embodiment of the present invention is similar to Embodiments 1 and 2 described above except matters described below. Therefore, matters except differences from Embodiments 1 and 2 described above are denoted with the same reference signs, and description is omitted.

In the present embodiment, the second contacting portion 31 of the second plunger 30 of the contact pin 15 in Embodiment 1 described above is changed to a second contacting portion 231 having a different tip shape as shown in FIG. 14 and FIG. 15. Hereinafter, the second contacting portion 231 of the present embodiment will be described.

As shown in FIG. 14 and FIG. 15, the second contacting portion 231 of the present embodiment has a plurality of (eight herein) convex portions 235 in the same manner as in Embodiment 1 described above, but is different in a shape of each convex portion.

As shown in FIG. 14 and FIG. 15, the plurality of convex portions 235 of the present embodiment are formed around a center 231b of a tip surface facing a solder ball 2a, in a tip portion 231a of the second contacting portion 231 that comes in contact with the solder ball 2a. As shown in FIG. 14 and FIG. 15, a pair of two convex portions is disposed in each of four regions provided at substantially equal intervals in a periphery of a substantially round shape in planar view. Each of the eight convex portions 235 is formed so that a tip side of each of four protruding shape portions 238 provided at substantially equal intervals is further divided into two portions. Furthermore, this convex portion 235 is formed so that a protruding height of the portion increases from an inner circumferential side toward an outer circumferential side, and a tip side of the convex portion on the outer circumferential side is a flat portion 235a formed by a plane that is perpendicular to an axial line L.

Furthermore, each of the flat portions 235a of the plurality of convex portions 235 is formed in a substantially fan shape, and a first peak-shaped portion 235b is formed to smoothly tilt and lower from a central portion of the substantially fan shape toward the center 231b of the second contacting portion 231. Additionally, a second peak-shaped portion 235c is formed to smoothly tilt and lower from an end on a center 231b side of the first peak-shaped portion 235b to the center 231b of the second contacting portion 131.

One first peak-shaped portion 235b is formed in each of the convex portions 235, and hence eight first peak-shaped portions are formed in total, and two first peak-shaped portions 235b are connected in a middle of the second contacting portion 231 toward the center 231b. Furthermore, the second peak-shaped portion 235c is formed to extend from a region where the two first peak-shaped portions 235b are connected, to the center 231b of the second contacting portion 231. One second peak-shaped portion is formed to two convex portions 235, and hence four second peak-shaped portions 235c are formed in total so that a tilt angle of the second peak-shaped portion is larger than an angle of the first peak-shaped portion 235b. Then, both or either of the first peak-shaped portion 235b and the second peak-shaped portion 235c comes in contact with the solder ball 2a, thereby electrically connecting an IC package 2 to an IC socket 10.

Furthermore, a first valley-shaped portion 236 and a second valley-shaped portion 237 are alternately provided between the respective convex portions 235. In the present embodiment, the first valley-shaped portion 236 is provided between the four protruding shape portions 238 provided at substantially equal intervals, and the second valley-shaped portion 237 is provided between two convex portions 235 in each of the four protruding shape portions 238.

Additionally, in the first valley-shaped portion 236 and the second valley-shaped portion 237 of the present embodiment, both a first valley bottom portion 236a and a second valley bottom portion 237a are formed in a flat strip shape. Additionally, two strip-shaped first valley bottom portions 236a are formed to intersect at the center 231b of the second contacting portion 231. In addition, the second valley-shaped portion 237 is linearly formed to extend to the outer circumferential side from a region of a predetermined length away from the center 231b toward the outer circumferential side on a surface that is shallower than the first valley-shaped portion 236 having a depth from a tip of the second contacting portion 231, in the plane (the substantially horizontal plane) that is perpendicular to the axial line L in the second contacting portion 231.

That is, the first valley bottom portion 236a in the present embodiment is formed at a deep position from the tip of the second contacting portion 231, and the second valley bottom portion 237a is formed at a shallow position from the tip of the second contacting portion 231, so that the valley bottom portions 236a and 237a have a difference in level between the portions.

Next, description will be made as to an operation of the IC socket 10 including the contact pin 15 having the second plunger 30 in which the second contacting portion 231 is formed. Note that description similar to the above descriptions of Embodiments 1 and 2 is omitted.

According to the contact pin 15 of the present embodiment, a set of two convex portions 235 having the first peak-shaped portions 235b is disposed in each of four regions provided at substantially equal intervals. Therefore, the solder ball 2a can be brought into contact with the first peak-shaped portion 235b and the second peak-shaped portion 235c more stably by the contact pin than by a conventional contact pin having four protruding portions.

Furthermore, according to the contact pin 15 of the present embodiment, the first valley bottom portion 236a and the second valley bottom portion 237a are formed in the flat strip shape, so that it is possible to prevent a defect that a waste peeled off from the solder ball 2a due to contact with the solder ball 2a is clogged in the valley bottom portions of the valley-shaped portions and can hardly be removed.

Additionally, when the IC package 2 is stored in a storage portion 14a and even when a position of the solder ball 2a to the second contacting portion 231 shifts, the flat portion 235a formed on the outer circumferential side of the first peak-shaped portion 235b in the convex portion 235 comes in contact with the solder ball 2a. Consequently, for example, a pointed tip of the contacting portion does not pierce the solder ball 2a, and the solder ball is not damaged. The second contacting portion 231 does not bite into the solder ball 2a and does not leave any indentations, and can give rise to a state where burrs are hard to occur. As a result, the contact pin 15 with good yield can be obtained.

Embodiment 4 of Invention

FIG. 16 shows Embodiment 4 of the present invention. Note that the embodiment of the present invention is similar to Embodiments 1 to 3 described above except matters described below. Therefore, matters except differences from Embodiments 1 to 3 described above are denoted with the same reference signs, and description is omitted.

In the present embodiment, the second contacting portion 231 of the second plunger 30 of the contact pin 15 in Embodiment 3 described above is changed to a second contacting portion 331 having a different tip shape as shown in FIG. 16. Hereinafter, the second contacting portion 331 of the present embodiment will be described.

As shown in FIG. 16, the second contacting portion 331 of the present embodiment has a plurality of (eight herein) convex portions 335 in the same manner as in Embodiment 3 described above, but is different in a shape of each convex portion.

In the second contacting portion 331 of the present embodiment, as shown in FIG. 16, an outer wall portion 360 is disposed on an outer circumferential side of a first valley-shaped portion 336 and a second valley-shaped portion 337, to close the valley-shaped portions. The outer wall portion 360 may be formed integrally with the second contacting portion 331 or may be formed separately from the second contacting portion 331 and locked from the outer circumferential side of the second contacting portion 331.

Next, description will be made as to an operation of an IC socket 10 including the contact pin 15 having the second plunger 30 in which the second contacting portion 331 is formed. Note that description similar to the above descriptions of Embodiments 1 to 3 is omitted.

According to the contact pin 15 of the present embodiment, there is provided the outer wall portion 360 that closes the outer circumferential side of the first valley-shaped portion 336 and the second valley-shaped portion 337, so that it is possible to prevent a defect that a waste peeled off from a solder ball 2a due to contact with the solder ball 2a passes through a flat first valley bottom portion 336a and a flat second valley bottom portion 337a, drops from the contact pin 15, leaks to the outside, and is scattered to and adversely affects the IC socket 10, a wiring substrate 1 and the like.

Note that in Embodiments 1 to 4 described above, eight convex portions 35, 135, 235 or 335 are disposed in the second contacting portion 31, 131, 231 or 331, but the present invention is not limited to these embodiments, and a number of the convex portions does not have to be 8 and may be 7 or less or 9 or more, when the solder ball can be stably supported.

Furthermore, in Embodiments 2 to 4 described above, four protruding shape portions 138, 238, or 338 are disposed at equal intervals in the second contacting portion 131, 231 or 331, but the present invention is not limited to these embodiments. When the solder ball can be stably supported, the protruding shape portions do not have to be disposed at equal intervals, and a number of the protruding shape portions does not have to be 4, and may be 3 or 5 or more.

Additionally, the shapes of the convex portion, the protruding shape portion, the flat portion, the valley-shaped portion and the like are not limited to the shapes of Embodiments 1 to 4 described above, and the portions may be formed into other shapes.

Note that "the electrical contact" of the present invention is not limited to the contact pin having such a structure as described above in Embodiments 1 to 4, and the present invention is also applicable to another structure. Furthermore, in Embodiments 1 to 4 described above, "the electric component socket" of the present invention is applied to the type of IC socket that does not have any covers and has the open upper surface. However, the present invention is not limited to this example, and is also applicable to an IC socket having the cover or the like, or a device other than the IC socket.

REFERENCE SIGNS LIST 1 wiring substrate
2 IC package (electric component)
2a solder ball (terminal)
10 IC socket (electric component socket)
14 socket main body
15 contact pin (electrical contact)
20 first plunger
21 first contacting portion
30 second plunger
31, 131, 231, and 331 second contacting portion (contacting portion)
31a, 131a, and 231a tip portion
31b, 131b, and 231b center
35, 135, 235, and 335 convex portion
35a, 135a, 235a, and 335a flat portion
35b peak-shaped portion
135b, and 235b first peak-shaped portion (peak-shaped portion)
135c, and 235c second peak-shaped portion (peak-shaped portion)
36 valley-shaped portion
36a valley bottom portion
136, 236, and 336 first valley-shaped portion (valley-shaped portion)
136a, 236a, and 336a first valley bottom portion (valley bottom portion)
137, 237, and 337 second valley-shaped portion (valley-shaped portion)
137a, 237a, and 337a second valley bottom portion (valley bottom portion)
40 tubular member
50 coil spring
360 outer wall portion

The invention claimed is:

1. An electrical contact comprising:
a contacting portion including convex portions provided around a center of a tip portion of the contacting portion, wherein
each of the convex portions has a flat portion on an outer circumferential side and formed by a plane that is perpendicular to an axial line of the electrical contact, and a peak-shaped portion extending from the flat portion toward the center so as to be contactable with a terminal of an electric component, and
the contacting portion has valley-shaped portions, each valley-shaped portion being formed between adjacent convex portions of the convex portions.

2. The electrical contact according to claim 1, wherein the valley-shaped portions comprise a combination of the valley-shaped portions having different valley depths.

3. The electrical contact according to claim 2, wherein each valley-shaped portion comprises a valley bottom portion, and at least a part of the valley bottom portion has a flat strip shape.

4. The electrical contact according to claim 2, wherein the valley-shaped portions comprise a combination of valley-shaped portions that each include a valley bottom portion having a flat shape and valley-shaped portions that each include a valley bottom portion having a V-shape.

5. The electrical contact according to claim 1, further comprising an outer wall portion that surrounds an outer circumferential side of each of the valley-shaped portions.

6. An electric component socket comprising:
a socket main body positionable on a wiring substrate and having a storage portion in which an electric component having terminals is storable, and
the electrical contact according to claim 1 disposed in the socket main body to, with the socket main body positioned on the wiring substrate and the electric component having terminals stored in the storage portion, come in contact with each of the terminals.

7. The electrical contact according to claim 2, further comprising an outer wall portion that surrounds an outer circumferential side of each of the valley-shaped portions.

8. The electrical contact according to claim 3, further comprising an outer wall portion that surrounds an outer circumferential side of each of the valley-shaped portions.

9. The electrical contact according to claim 4, further comprising an outer wall portion that surrounds an outer circumferential side of each of the valley-shaped portions.

10. An electric component socket comprising:

a socket main body positionable on a wiring substrate and having a storage portion in which an electric component having terminals is storable, and the electrical contact according to claim 2 disposed in the socket main body to, with the socket main body positioned on the wiring substrate and the electric component having terminals stored in the storage portion, come in contact with each of the terminals.

11. An electrical contact comprising:

a contacting portion including convex portions provided around a center of a tip portion of the contacting portion, wherein each of the convex portions has a flat portion on an outer circumferential side, and a peak-shaped portion extending from the flat portion toward the center so as to be contactable with a terminal of an electric component, the contacting portion has valley-shaped portions, each valley-shaped portion being formed between adjacent convex portions of the convex portions, and the valley-shaped portions comprise a combination of the valley-shaped portions having different valley depths.

12. An electric component socket comprising:

a socket main body positionable on a wiring substrate and having a storage portion in which an electric component having terminals is storable, and the electrical contact according to claim 11 disposed in the socket main body to, with the socket main body positioned on the wiring substrate and the electric component stored in the storage portion, come in contact with each of the terminals.

* * * * *